United States Patent [19]
Yamada et al.

[11] Patent Number: 5,482,571
[45] Date of Patent: Jan. 9, 1996

[54] SOLAR CELL MODULE

[75] Inventors: Satoru Yamada, Kyoto; Takahiro Mori, Ikoma; Ichiro Kataoka, Kyoto; Shigenori Itoyama, Nara, all of Japan

[73] Assignee: Canon Kabushiki Kaisha, Tokyo, Japan

[21] Appl. No.: 257,287

[22] Filed: Jun. 9, 1994

[30] Foreign Application Priority Data

Jun. 14, 1993 [JP] Japan ................................. 5-142313

[51] Int. Cl.$^6$ .................................................. H01L 31/048
[52] U.S. Cl. .......................... 136/259; 136/251; 136/258; 257/433; 257/434
[58] Field of Search ........................ 136/251, 258 AM, 136/259; 257/433, 434

[56] References Cited

FOREIGN PATENT DOCUMENTS

| | | |
|---|---|---|
| 2539419 | 7/1984 | France ................................... 136/251 |
| 2751517 | 5/1979 | Germany . |
| 57-143872 | 6/1982 | Japan ................................... 136/251 |
| 59-56776 | 2/1984 | Japan ................................... 136/251 |
| 61-251176 | 8/1986 | Japan ................................... 136/251 |
| 1-244669 | 9/1989 | Japan ................................... 136/251 |
| 750575 | 7/1978 | U.S.S.R. . |

*Primary Examiner*—Aaron Weisstuch
*Attorney, Agent, or Firm*—Fitzpatrick, Cella, Harper & Scinto

[57] ABSTRACT

A solar cell module, with excellent transparency, scratch resistance, weather resistance, and flame retarding property, is obtained by covering the outermost surface with a surface covering material comprising a trifluorochloroethylene-vinyl copolymer, and employing a hard film as part of the surface covering material under the trifluorochloroethylene-vinyl copolymer. The hard film and trifluorochloroethylene-vinyl copolymer are laminated and adhered with a filler to the photovoltaic element of the solar cell module.

12 Claims, 5 Drawing Sheets

SCRATCH TESTER

FIG. 8

SOLAR CELL MODULE

BACKGROUND OF THE INVENTION

1. Field of the Invention

The present invention relates to a surface covering for a solar cell module in which a photovoltaic element having a photoactive semiconductor layer serving as the photoelectric converting member is protected with resin, and more particularly a solar cell module capable of showing excellent performance even under exterior conditions.

2. Relates Background Art

Among the recent worldspread consciousness of ecological issues, the deepest concern is directed to the warming of the earth by $CO_2$ production, and the development and stable supply of clean energy are urgently desired objectives. The solar cell is one of the most promising clean energy sources because of its safety and ease of handling. Solar cells have been prepared in various forms such as (1) monocrystalline silicon solar cells; (2) polycrystalline silicon solar cells; (3) amorphous silicon solar cells; (4) copper-indium selenide solar cells; and (5) compound semiconductor solar cells. Among these types of cells, the thin film crystalline silicon solar cells, compound semiconductor solar cells, and amorphous silicon solar cells are recent targets of active development as they are relatively inexpensive and can be formed into a large area.

Even among these cells, the amorphous (non-monocrystalline) solar cells, prepared by depositing silicon on a conductive metal substrate and forming a transparent conductive layer thereon, is considered promising as a future solar cell module, as it is light in weight, excellent in impact resistance, and extremely flexible. However, different form the cells where silicon is deposited onto a glass substrate, the surface at the light entrance side has to be coated with a transparent coating material in order to protect the solar cell.

Figure 3:
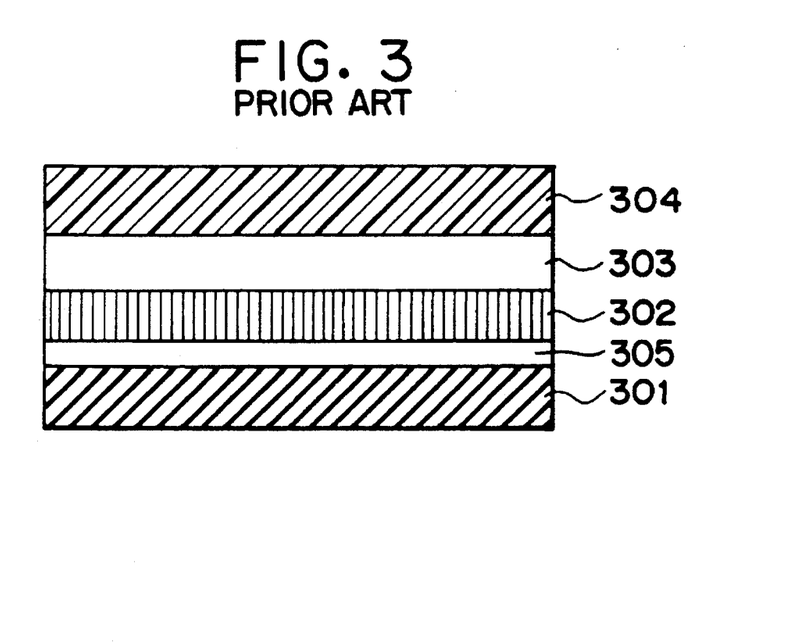
FIG. 3 is a schematic cross-sectional view of a conventional solar cell module.

Glass and resinous material of high weather resistance, such as fluorinated resin, have been employed for such surface coating material. FIG. 3 shows an example of such solar cell module, in which there are provided a layer 304 of glass or resin of high weather resistance; a filler layer 303; a solar cell 302; a filter layer 305; and an insulating layer 301. The requirements for the coating material to be employed for surface protection of the solar cell module include high weather resistance, high moisture resistance, and high protecting ability.

In relation to the above-mentioned requirements for the coating material, the Japanese Patent Publication No. 4-7229 discloses, for a solar cell composed of a substrate and CdS/CdTe formed thereon, a protective film composed of a derivative of a resin containing perfluoroalkylene radicals and active hydrogen atoms. Luminflon (manufactured by Asahi Glass Col, Ltd.) is cited as an example of the resin containing perfluoroalkylene radicals and active hydrogen atoms. According to the above-mentioned patent specification, Lumiflon is a fluorine-containing polymer with a number-averaged molecular weight of 20,000 to 80,000, containing perfluoroalkylene radicals and pendant active hydrogen atoms, or more specifically, OH radicals, and reacts with melamine or a compound containing isocyanate radicals to form crosslinked polymer, termed a derivative in said specification. The above-mentioned patent specification also discloses, in the description of examples, the preparation of a protective film of high moisture resistance by crosslinking Lumiflon with an isocyanate or resol phenolic resin.

The coating film disclosed in the above-mentioned patent must be positioned at the outermost surface of the solar cell module. The resin, after mixing with the crosslinking agent, generally has a short pot life, which in practice has to be extend by protecting the isocyanate with a blocking agent. Thus, if a laminated structure is intended to be formed in which a surficial film is laminated on the resin, the crosslinking reaction may not proceed properly as the blocking agent cannot be liberated and evaporated.

Also, the lamination of the surficial film after the crosslinking of resin is difficult because the crosslinked substance lacks adhesiveness or stickiness. Moreover, an effective blocking agent is not known if melamine is employed as the crosslinking agent. For these reasons, the above-mentioned resin has to be used as the outermost surface of the solar cell module. However, such resin has a low surface hardness, generally in the order of B to H in pencil hardness, and is easily scratched by sand and dust present outdoors, and smear and dust may be deposited on such scratches to eventually block the solar light. Also such resins, if simply painted, tends to cause formation of pinholes or dust, causing introduction of moisture or oxygen to the photovoltaic element. Thus, there has not been known an organic surface coating material capable of providing a high level weather resistance and moisture resistance.

Glass coating is best for preventing moisture absorption and yellow discoloration, and has therefore been employed frequently for sealing the solar cells. However, such glass coating is poor in flexibility, impact strength, weight, and cost.

Figure 7:
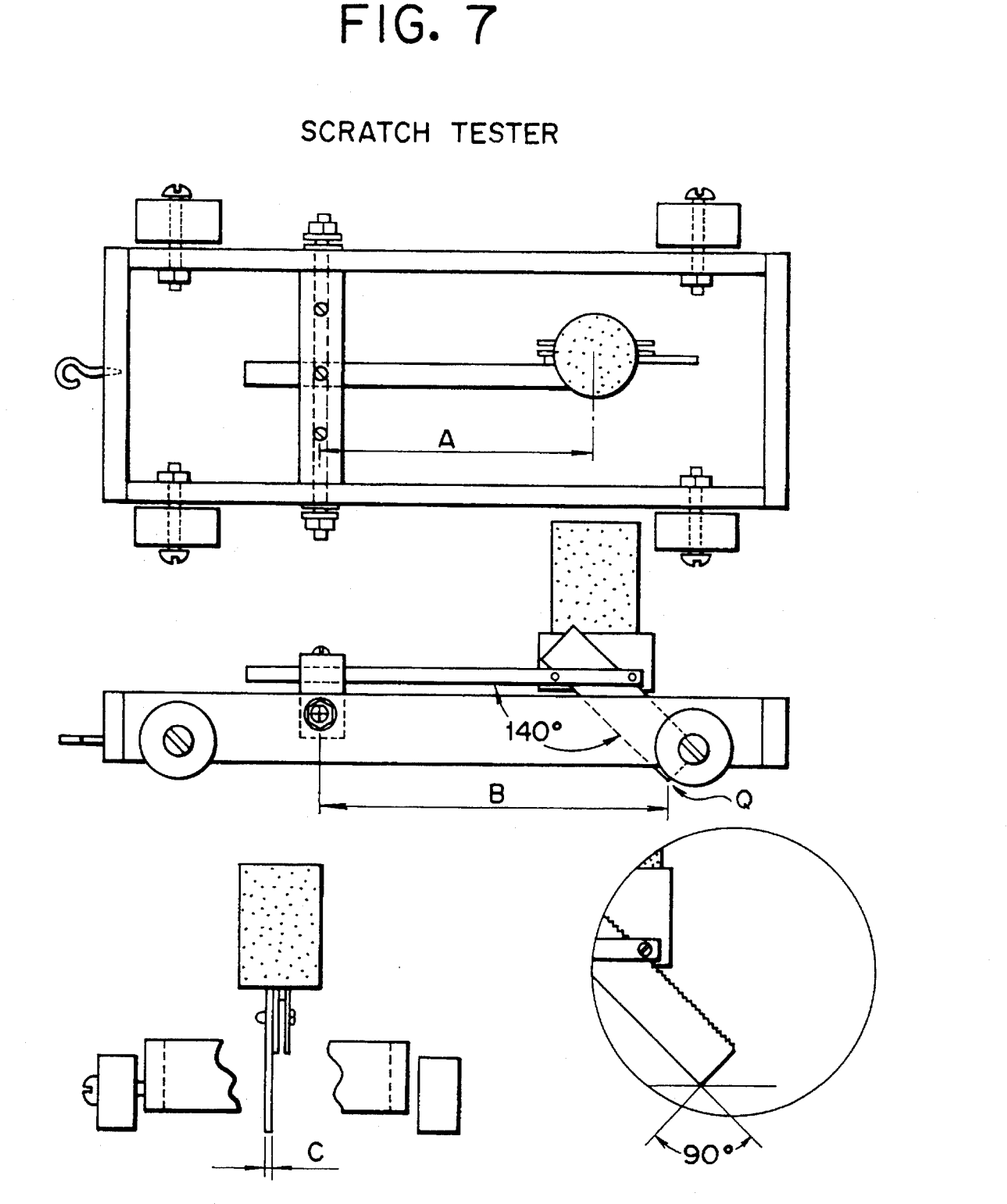
FIG. 7 is a schematic view of a testing machine employed in the scratch test.

Also, the protective ability is important not only for maintaining the performance of the solar cell module itself but also for safety consideration. The protective ability of the surface coating material can be tested with a "scratch test" in which, with a testing machine shown in FIG. 7, a steel blade is moved along the surface of the solar cell, with a speed of 152.4 mm/sec. and under a load of 907 g, and the solar cell passes this test if the electrical properties thereof show no defects in the electrical test thereafter.

The Japanese Patent Laid-open Application No. 59-56776 discloses a method of producing a solar cell module, featured by preparing a composite sheet consisting of a plastic sheet (or film) having a softening point of 120° C. or higher and having high optical transparency and a polyacrylic resin layer of a softening point of 120° C. or lower formed thereon, and either a polyacrylic resin sheet of a softening point of 120° C. or lower or a laminated sheet consisting of the resin sheet and a moisture preventing sheet, placing a solar cell element between the resin layers and applying heat and pressure to fuse or soften at least one of the acrylic resin layers, thereby sealing the solar cell element. According to the specification of the above-mentioned application, the plastic sheet (or film) can be composed of any plastic material having a softening point of 120° C. or higher and being optically transparent, and can be a sheet or a film of polycarbonate, polyamide resin, hard polyvinyl chloride resin, or polyfluoroethylene resin. The recommended range of thickness is about 50 to 800 μm. It is also disclosed that the surface of the sheet of film may be treated, for example, with silicon or magnesium fluoride in order to improve stress crack resistance.

However, the weather resistance is still defective even when employing a polycarbonate film as the hard film and silicone or magnesium fluoride as the surface coating material, because such surface coating material is incapable of blocking the ultraviolet light which induces deterioration and discoloration of polycarbonate. For this reason, there is no disclosure of the weather resistance of the hard film employed in the solar cell module.

For laminating these materials, there is usually employed the method of superposing the surface covering material, the photovoltaic element and the rear covering material, with thermoplastic resin used as the filler layer 301, and heating these members under vacuum.

However, the surface covering material, if composed of glass, increases the weight and the cost, though it can pass the scratch test mentioned above. On the other hand, fluorinated resin cannot pass the scratch test unless the filler is made thick enough, because the hardness of such fluorinated resin is low. Besides, if the filler is made thicker in order to pass the scratch test, the solar cell module may become combustible and unsuitable for use as a roofing material or the like. For resolving such drawbacks there should be employed a covering material of a higher hardness, instead of the fluorinated resin, but so far thee has not been known any material having weather resistance, water repellency, and which is superior to fluorinated resin in performance.

SUMMARY OF THE INVENTION

In consideration of the foregoing, an object of the present invention is to provide a surface covering material for a solar cell module, capable of minimizing the long-term deterioration of the performance thereof and ensuring improved safety thereof, thereby enabling inexpensive and stable manufacture of the solar cell module.

According to the present invention, there is provided a solar cell module with a photovoltaic element having at least a photoactive semiconductor layer as the photoelectric converting layer, characterized by at least the outermost surface of the surface covering material at the light entrance side being composed of trifluorochloroethylene-vinyl copolymer.

The present invention provides the following advantages:

(1) Use of trifluorochloroethylene-vinyl copolymer at the outermost surface of the surface covering material at the light entrance side provides a surface covering material of excellent weather resistance. Use of the fluorinated resin at the portion of the solar cell module requiring the highest weather resistance ensures sufficient weather resistance at the outermost surface. Besides, different from other resins, trifluorochloroethylene-vinyl copolymer has mutual solubility with additive materials. Furthermore, because of the low film forming temperature, the organic additive materials evaporate or decompose less during the film forming operation. Consequently, it is possible to improve the weather resistance of the underlying covering material by the addition of an ultraviolet absorber at the outermost surface. Furthermore, the low film forming temperature can reduce the thermal damage to the photo-voltaic element. More specifically, the influence of the conductive paste, solder etc. employed in the electrical connection of the photovoltaic element can be reduced, whereby the weather resistance and reliability in repeated use can be improved;

(2) Lamination of the surface covering material in the order of filler, hard film, and trifluorochloroethylene-vinyl copolymer provides a surface covering material with excellent scratch-resistance. More specifically, high scratch-resistance can be ensured by the presence of the hard film as the intermediate material of the surface covering material. Also, use of the filler prevents formation of gaps in the surface covering material, even on a photovoltaic element with an irregular surface; and (3) Addition of an inorganic ultraviolet absorber to trifluorochloroethylene-vinyl copolymer allows retention of the ultraviolet absorbing effect of a prolonged period, thereby ensuring long-term weather resistance of the covering material.

DETAILED DESCRIPTION OF THE PREFERRED EMBODIMENTS

Figure 1:
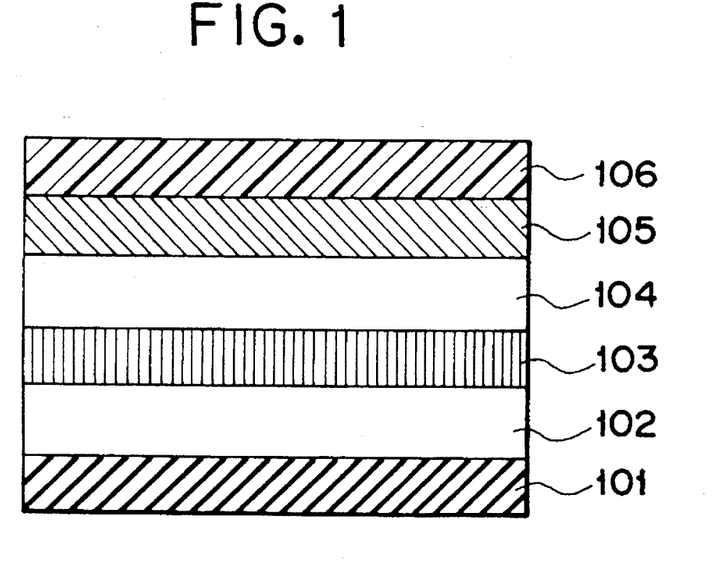
FIG. 1 is a schematic cross-sectional view of a first embodiment of the solar cell module of the present invention.

FIG. 1 schematically illustrates the configuration of a solar cell module of the present invention, composed of an insulator layer 101; a solar cell 103; filler layers 102, 104; a hard film layer 105; and an outermost trifluorochloroethylene-vinyl copolymer layer 106. The light enters form the outermost surface 106, then passes through the hard film 105 and the filler 104, and reaches the solar cell 103 thereby generating electricity.

Rear Insulating Film 101

The rear insulating film 101 is provided for insulation in the case of a photovoltaic element with a conductive substrate, and can for example be composed of nylon, polyethylene, polyester, or polystyrene.

Rear Filler 102

The filler to be used at the rear side is required to have adhesive strength, weather resistance, and the ability to fill irregularities, but may be opaque. Examples of the material for the filler include fluorinated resin, ethylene-vinyl acetate copolymer (EVA), polyvinylbutyral (PVB), silicone resin, epoxy resin, and acrylic resin.

Such resin may contain as an additive a crosslinking agent, or an agent against thermal oxidation for improving heat resistance, or an ultraviolet absorber or an agent against photo-oxidation for improving photostability.

Photovoltaic Element 103

Figure 2:
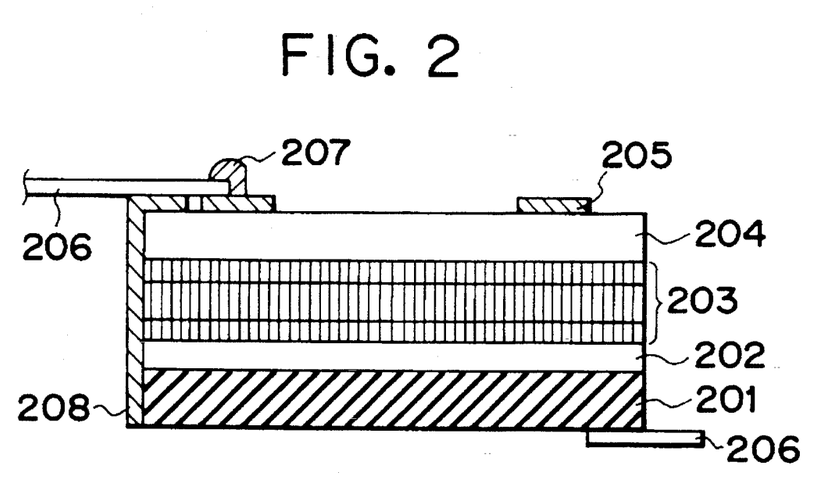
FIG. 2 is a schematic cross-sectional view showing the basic configuration of a photovoltaic element, to be employed in the solar cell module shown in FIG. 1.

The photovoltaic element 103 of the present invention is preferably provided with a photoactive semiconductor layer, as the light converting member, on a conductive substrate. It is constructed, as schematically shown in FIG. 2, by a conductive substrate 201; a rear reflective layer 202; a photoactive semiconductor layer 203; a transparent conductive layer 204; and a current collecting electrode 205.

The conductive substrate 201 serves as the substrate for eh photovoltaic element and also as a lower current-collecting electrode. It may be composed for example of silicon, tantalum, molybdenum, tungsten, stainless steel, aluminum, copper, titanium, a carbon sheet, a lead-plated steel plate, or a resinous film or a ceramic member bearing a conductive layer thereon.

On the conductive substrate 201, there may be formed, as the rear reflective layer 202, a metal layer and/or a metal oxide layer. The metal layer can be composed, for example, of Ti, Cr, Mo, W, Al, Ag, or Ni, an the metal oxide layer can be composed, for example, of ZnO, $TiO_2$, or $SnO_2$. The metal layer and metal oxide layer can be formed, for example, by resistance-heated evaporation, electron beam evaporation, or sputtering.

The photoactive semiconductor layer 203 is provided for effecting photoelectric conversion, and can be composed, for example, of polycrystalline silicon with a pn junction, amorphous silicon with a pin junction, or a compound semiconductor heterojunction such as $CuInSe_2$, $CuInS_2$, GaAs, $CdS/Cu_2S$, CdS/CdTe, CdS/InP, or $CdTe/Cu_2Te$. The photoactive semiconductor layer can be formed, for example, by thermal treatment of an amorphous silicon sheet prepared from fused silicon in the case of polycrystalline silicon, or plasma CVD employing silane gas etc. in the case of amorphous silicon, or ion plating, ion beam deposition, vacuum evaporation, sputtering, or electrophoresis in the case of a compound semiconductor.

The transparent conductive layer 204 serves as the upper electrode of the photovoltaic element. It can be composed, for example, of $In_2O_3$, $SnO_2$, $In_2O_3$-$SnO_2$ (ITO), ZnO, $TiO_2$, $Cd_2SnO_4$, a crystalline semiconductor layer doped with an impurity at a high concentration, or a translucent thin metal layer, and can be formed, for example, by resistance-heated evaporation, sputtering, spray coating, CVD, or impurity diffusion.

On the transparent conductive layer, there can be provided a grid-shaped current-collecting electrode 205 for efficiently collecting the current. The current-collecting electrode 205 can be composed, for example of conductive paste, prepared by dispersing finely powdered silver, gold, cooper, nickel, or carbon in a polymer binder. The polymer binder can be composed, for example, of polyester resin, epoxy resin, acrylic resin, alkyd resin, polyvinyl acetate resin, rubber, urethane resin, or phenolic resin. Also, instead of the application of the conductive paste, the current-collecting electrode 205 can also be formed by sputtering, resistance-heated evaporation or CVD employing a mask pattern, evaporation of a uniform metal film followed by removal of unnecessary portions by etching, direct formation of a grid electrode pattern by photoactive CVD, plating with a negative mask of the grid-pattern electrode, or thin metal wires coated with hardened conductive paste.

Finally, output terminals 206 are mounted on the conductive substrate and the current-collecting electrode in order to collect the generated electric current. The mounting on the conductive substrate is achieved by connecting a metal member, such as a copper tab, by spot welding or soldering, and that on the current-collecting electrode is achieved by connecting a metal member with conductive adhesive or solder 207. An insulator 208 is preferably provided in order to prevent short circuiting caused by contact of the output terminal with the conductive substrate or the semiconductor layer, at the mounting on the current-collecting electrode.

The photovoltaic elements so prepared are connected in serial or parallel according to the desired voltage or current. Also, the photovoltaic elements may be formed in an integrated manner on an insulated substrate, thereby providing a desired voltage or current.

Filler 104 at the Light Entrance Side

The filler 104 as the light entrance side is required to be transparent no the light absorbed by the photovoltaic element, and to be adhesive to the photovoltaic element 103 and to the hard film 105. It also has to be thermoplastic in order to fill the surface irregularities on the solar cell 103 constituting the photovoltaic element, thereby maintaining the smoothness of the hard film 105. Furthermore, in consideration of the portion of the photovoltaic element, it is preferably provided with a certain level of scratch resistance and impact absorbing ability. It can be composed, for example, of fluorinated resin, ethylene-vinyl acetate copolymer (EVA), polyvinyl butyryl (PVB), silicone resin, epoxy resin or acrylic resin, but fluorinated resin is particularly preferably as the filler at the light entrance side, in consideration of the weather resistance. An example of such fluorinated resin is trifluorochloroethylene-vinyl copolymer.

The monomer to be copolymerized with trifluorochloroethylene can be a vinyl ether monomer or a vinyl ester monomer. The vinyl ether monomer can have a side chain such as methyl, ethyl, propyl, n-butyl, 2-butyl, tert-butyl, n-hexyl, or cyclohexyl radical. The trifluorochloroethylene-vinyl copolymerization is known to achieve almost uniformly mixed copolymerization, regardless of the relative amounts of the monomers prior to the polymerization. Consequently, for ensuring flexibility in the copolymer, there is effectively employed a long alkyl radical at least equal to butyl radical or a side chain with steric hindrance such as cyclohexyl radical. If adhesive power to the photovoltaic element or to the surfacial film is required in addition to the flexibility, it is preferable to copolymerize a vinyl ester monomer. The side chain of the vinyl ester monomer can be an alkyl radical similar to that for the vinyl ether monomer.

Also effective is mixture of polyfluorovinylidene and acrylic resin, with a preferred mixing ratio within a range from 1/9 to 4/6. A mixing ratio lower than 1/9 cannot exploit the weather resistance of polyfluorovinylidene or suffers form the lack of flexibility of acrylic resin, while a mixing ratio higher than 4/6, though providing sufficient weather resistance, requires a temperature of 200° C. or higher for thermal lamination, thus leasing to excessive crosslinking or deterioration by oxidation of the organic resin etc. employed in the current-collecting electrode.

Also, thermal lamination at 200° C. or higher cannot provide sufficient adhesion to the photovoltaic element or to the surfacial film, even though thermoplasticity is present.

The acrylic resin to be employed in the present invention is not particularly limited, and examples of the principal monomer constituting the acrylic resin include methyl (meth)acrylate, ethyl (meth)acrylate, 2-propyl (meth)acrylate, and n-propyl (meth)acrylate. If flexibility is required in the filler, butyl (meth)acrylate or 2-ethylhexyl (meth)acrylate can be copolymerized. Copolymerization of styrene is also conceivable for educing the moisture absorption of acrylic resin.

Hard Film 105

The hard film to be employed in the present invention is not strictly defined, but it preferably has a thermal deformation temperature of 70° C. or higher. The thermal deformation temperature can be defined, for example, by the deformation temperature under a load of 4.6 kg/cm$^2$ according to ASTM-D648-56. The properties required for the hard film 105 are transparency, weather resistance, and scratch resistance. Examples of the preferred material therefor in the present invention include polyethylene, polystyrene, fluorinated resin, polycarbonate, acrylic resin cellulose resin, polyester, and polyamide resin. More preferred is polycarbonate, polyethylene terephthalate polyester, and acrylic resin. In particular, polycarbonate has a high mechanical strength and is also excellent in weather resistance.

The film may be elongated for increasing the mechanical strength. Particularly, a biaxially elongated film shows a tensile strength of 2 to 5 times of that of the unelongated film, also shows a significant increase in the initial modulus and the impact strength, and has a very high mechanical strength. Furthermore, the transparency and the usable temperature range can be improved by such biaxial elongation, so that such elongated film is suitable as the covering material for the solar cell module.

Trifluorochloroethylene-vinyl Copolymer 106 at the Outermost Surface

The monomer to be employed in the copolymer at the outermost surface of the present invention can be vinyl ether monomer or vinyl ester monomer. The vinyl ether monomer can be provided with a side chain such as methyl, ethyl, propyl, n-butyl, 2-butyl, tert-butyl, n-hexyl, or cyclohexyl radical. Trifluorochloroethylene-vinyl copolymerization is known to achieve substantially uniformly mixed copolymerization regardless of the relative amount of the monomers prior to polymerization.

It is already known to achieve crosslinking by copolymerizing a monomer having a hydroxyl radical. Particularly preferred for such monomer having a hydroxyl radical is 2-hydroxy (meth)acrylate.

The copolymer can be crosslinked with an isocyanate, melamine, or an organic peroxide.

The isocyanates can be generally classified into aromatic ones and aliphatic ones. Those generally free of yellow discoloration are mostly the aliphatic ones, such as hexamethylene diisocyante, isophorone diisocyanate, hydrogenated methylene bis(phenylisocyanate) etc. An aromatic isocyanate known to be free from yellow discoloration is trilene diisocyanate.

The isocyanate mentioned above can be employed singly, but is often used fin the state of an oligomer, called an adduct or prepolymer, with a polyhudric alcohol. Such form can reduce the time required for crosslinking, as the crosslinking reaction is partly completed. Also, it can avoid loss by evaporation even in the case of crosslinking at a high temperature, because of a larger molecular weight. It is furthermore advantageous in terms of safety, as the larger molecular weight reduces the amount of vapor inhaled by humans or the amount absorbed by the skin.

The isocyanate is rarely used in the free form, in consideration of the pot life of the prepared mixture, but the activity of isocyanate can be blocked by a blocking agent.

For such blocking agent, there can be used phenols, alcohols, active methylenes, mercaptans, acid amides, imides, amines, imidazoles, ureas, carbamates, imines, oximes, and sulfite salts.

Examples of such phenol blocking agent include phenol, cresol, xylenol, p-ethylphenol, o-isopropylphenol, thymol, p-naphthol, p-nitrophenol and p-chlorophenol. Examples of such alcohol blocking agent include methanol, ethanol, propanol, butanol, ethylene glycol, methyl cellosolve, butyl cellosolve, methylcarbitol, benzyl alcohol, phenyl cellosolve, furfuryl alcohol, and cyclohexanol.

Also, examples of active methylenes include dimethyl malonate, diethyl malonate, and ethyl acetoacetate, and those of mercaptans include butylmercaptane, tiophenol, and tertdodecylmercaptan.

Examples of acid amides include acetoanilide, acetonicidide, acetamide, and benzamide, and those of imides include succinimide and maleimide.

Example of amines include diphenylamine, phenylnaphthylamine, aniline, and carbazole, and those of imidazoles include imidazole and 2-ethylimidazole.

Examples of urea blocking agents include urea, thiourea, and ethyleneurea, while those of carbamates include phenyl N-phenylcarbamate and 2-oxazolidone, while those of imines include ethylenimine. Examples of oximes include formaldoxime, acetaldoxime, methylethylketoxime, and cyclohexanonoxime, and those of sulfite salts include sodium bisulfite and potassium bisulfite.

Inorganic Ultraviolet Absorber

Organic ultraviolet absorbers are well known, but it is difficult to expect the ultraviolet blocking effect for a prolonged period, because of thermal decomposition or evaporation. For this reason, an inorganic ultraviolet absorber is employed in the present invention. In comparison with the well known organic ultraviolet absorbers such as benzophenone and benzotriazole, the inorganic ones are feature by ultraviolet blocking ability, long-term stability, heat resistance, and safety. Examples of such inorganic ultraviolet absorbers include zinc oxide, titanium oxide, yttrium oxide, and cerium oxide.

In the following the present invention will be further clarified by examples thereof, but it is to be understood that the present invention is by no means limited by these examples.

EXAMPLE 1

At first the procedure for preparing an amorphous (non-monocrystalline) silicon (a-Si) solar cell will be explained with reference to FIG. 2.

On a cleaned stainless steel substrate 201, there were successively formed by sputterings, as the rear reflective layer 202, an Al layer (5000 Å thick) and a ZnO layer (5000 Å thick). Subsequently, there was formed a photoelectric a-Si semiconductor layer 203 of a tandem configuration of n-layer (thickness 150 Å)/i-layer (thickness 4000 Å)/p-layer (thickness 100 Å)/n-layer (100 Å) by preparing n-conductive type (thickness 100 Å)/i-layer (thickness 800 Å)/p-layer (n-type) a-Si layers from a gaseous mixture of $SiH_4$, $PH_3$, and $H_2$ i-type a-Si layers from a gaseous mixture of $Si_4$ and $H_2$, and p-type microcrystalline μc-Si layers from a gaseous mixture of $SiH_4$, $BF_3$, and $H_2$, by plasma CVD. Then an $In_2O_3$ film of a thickness of 700 Å was formed as the transparent conductive layer 204, by resistance-heated evaporation of In in an $O_2$ atmosphere. Finally, the current-collecting grid electrode 205 was formed by screen printing of silver paste, whereby the photovoltaic element was completed. Each element had a size of 30 cm×15 cm, and two element were serially connected by adhesion with silver paste through copper tabs (thickness 50 μm). An output terminal was mounted on the stainless steel substrate, utilizing a copper tab (thickness 50 μm) and silver paste. An insulator 208 composed of polyamide resin (thickness 50 μm) was provided as shown in FIG. 2, and the other output terminal was connected, utilizing a copper tab (thickness 50 μm) and silver paste.

In the following, he outermost layer will be described.

A coating was prepared by mixing 100 parts of trifluorochloroethylene-vinyl copolymer, 18 parts of isocyanate containing a blocking agent as previously described, 1.5 parts of an inorganic ultraviolet absorber, 30 parts of fine silica powder, and 80 parts of xylene. On hard film, composed of polycarbonate (thickness 100 μm; corona treated on both sides), the above-mentioned coating was applied with a thickness of about 40 μm, and was subsequently hardened at 120° C. for 30 minutes.

Figure 4:
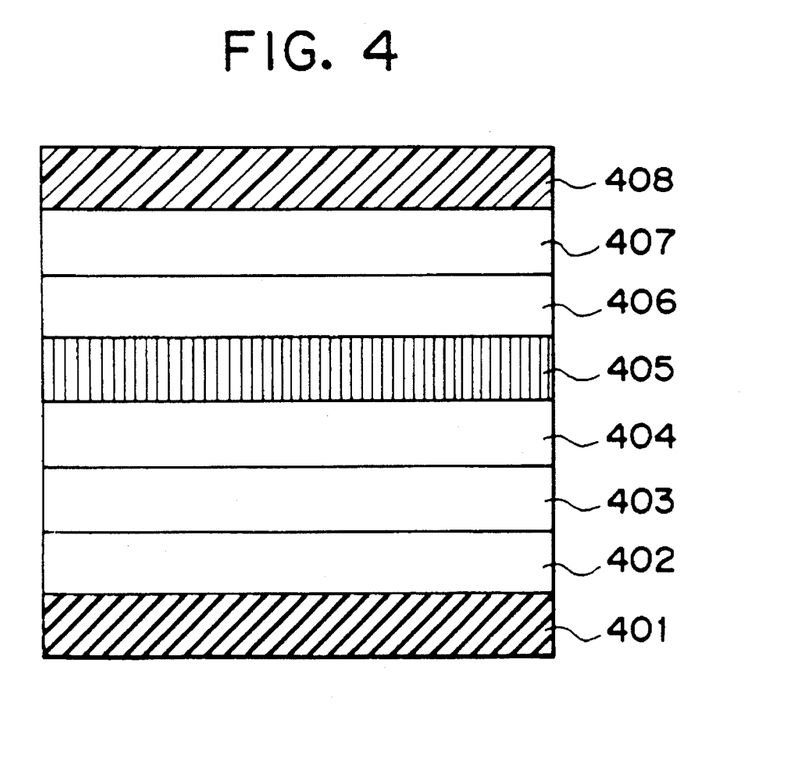
FIG. 4 is a schematic cross-sectional view of an example of the covering of the solar cell module of the present invention.

Referring now to FIG. 4, thermal lamination was conducted with an aluminum plate (thickness 20 mm) provided with a heat source. On the aluminum plate heated to 150° C., there were superposed, in succession, a galvanized steel plate 401 (thickness 0.3 mm); an EVA sheet (thickness 460 μm) as the rear filler 402; a nylon film (thickness 70 μm) as the rear insulator layer 403; and EVA sheet (thickness 460 μm) as the rear filler 404; a photovoltaic element 405; a filler 406 (thickness 300 μm); and polycarbonate/ trifluorochloroethylene-vinyl copolymer 407, 408 laminated as explained above, and a heat-resistance silicone rubber sheet (thickness 3 mm) was placed thereon. An O-ring was employed as the seal, and the pressure inside the laminating apparatus was reduced to 10 mmHg with a vacuum pump. The surface hardness of the obtained solar cell module was 4H in pencil hardness.

The solar cell module, prepared as explained above, was evaluated in the following tests:

(1) Conversion efficiency of solar cell;

Measurement of the conversion efficiency of the prepared solar cell module was conducted.

(2) Weather resistance;

The solar cell module was subjected, in a Sunshine Weather Meter, to an accelerated weathering test under repeated cycles of light irradiation and rain, and variation in the appearance and performance of the solar cell were evaluated after 5000 hours. The result is represented as + if no variation was observed in the appearance, ± if variation was observed but was of a level not affecting the practical use, and − if the solar cell showed peeling or bending.

(3) Temperature/humidity cycle:

The solar cell module was subjected to 20 temperature/humidity cycles of −40° C./1 hr and 85° C./85 %RH for 4 hrs., and variation in the appearance after the test was observed. The results were evaluated in a similar manner as in the test (2).

(4) Scratch resistance test:

A scratch test (UL standard) was conducted for testing whether the surface covering materials had sufficient protecting ability against external scratching. The test was conducted with a testing machine shown in FIG. 7, by moving a steel blade along the surface of this solar cell module, under a load of 907 g with a moving speed of 152.4 mm/sec. The solar cell module was subjected, after the scratch test, to a high-voltage insulation breakage test, and was regarded to have passed the scratch test if the module did not show a leakage current. The scratch test was conducted on the copper tab, positioned highest in the solar cell module of the present invention.

The high-voltage insulation breakage test was conducted in the following manner. After the scratch test, the solar cell module was short circuited between the anode and the cathode, and was immersed in a solution with an electrical conductivity of 3500 Ωcm or lower (containing 0.1% cf a surfactant Triton X-100), with the output terminals of the module being maintained out of the solution. After the portion of the module, subjected to the scratch test, was rubbed for about 10 seconds, the cathode terminal of a power source was immersed in the solution, and the other terminal of the power source was connected to the output terminal of the module. A voltage of 2000 V was applied by the power source, and the module was regarded to have passed the test if the current was less than 0.5 μA. IN table 1, the result is indicated by + or − respectively if the module passed or did not pass the test, and a case with poor reproducibility is indicated by ±.

(5) Flame retarding property:

The flame of a lighter was maintained close to the surface covering material of the solar cell module for 30 seconds, and the material was evaluated as flame retarding if the flame extinguished spontaneously or if the material did not shown and change after the flame was removed. The result was evaluated as + in case of flame retarding, or − if the flame did not extinguish spontaneously.

EXAMPLE 2

A solar cell module was prepared in the same manner as in Example 1, except that the inorganic ultraviolet absorber added to trifluorochloroethylene-vinyl copolymer was replaced by 2-hydroxy-4-n-octoxybenzophenone, an organic ultraviolet absorber. The obtained solar cell module has a pencil surface hardness of 4H.

EXAMPLE 3

A solar cell module was prepared in the same manner as in Example 1, except that the inorganic ultraviolet absorber added to trifluorochloroethylene-vinyl copolymer was replaced by 2-hydroxy-4-n-octoxybenzophenone, an organic ultraviolet absorber, and the trifluorochloroethylene-vinyl copolymer (corresponding to 408) at the outermost surface was employed in an amount of 200 parts. The obtained solar cell module showed a pencil surface hardness of 2H.

EXAMPLE 4

A solar cell module was prepared in the same manner as in Example 1, except that the inorganic ultraviolet absorber added to trifluorochloroethylene-vinyl copolymer was replaced by 2-hydroxy-4-n-octoxybenzophenone, an organic ultraviolet absorber, the trifluorochloroethylene-vinyl copolymer (corresponding to 408) at the outermost surface was employed in an amount of 200 parts, and PET (thickness 100 μm) was employed as the hard film 407. The obtained solar cell module showed a pencil surface hardness of 2H.

EXAMPLE 5

A solar cell module was prepared in the same manner as in Example 1, except that the inorganic ultraviolet absorber added to trifluorochloroethylene-vinyl copolymer was replaced by 2-hydroxy-4-n-octoxybenzophenone, an organic ultraviolet absorber, the trifluorochloroethylene-vinyl copolymer (corresponding to 408) at the outermost surface was employed in an amount of 200 parts, and an acylic film (thickness 100 μm) was employed as the hard film 407. The obtained solar cell module showed a pencil surface hardness of 2H.

EXAMPLE 6

A solar cell module was papered in the same manner as in Example 1, except that the inorganic ultraviolet absorber added to trifluorochloroethylene-vinyl copolymer was replaced by 2-hydroxy-4-n-octoxybenzophenone, an organic ultraviolet absorber, the trifluorochloroethylene-vinyl copolymer (corresponding to 408) at the outermost surface was employed in an amount of 200 parts, and EVA (thickness 300 μm) was employed as the filler 406. The obtained solar cell module sowed a pencil surface hardness of 2H.

Reference Example 1

Figure 5:
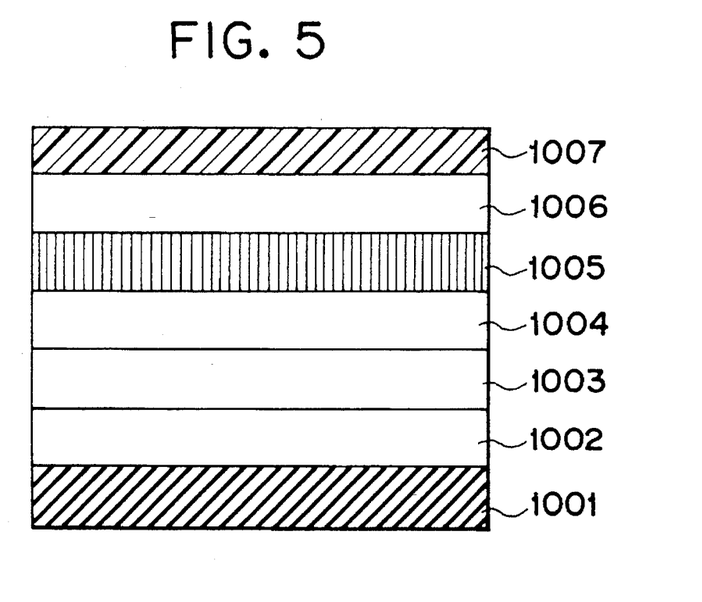
FIG. 5 is a schematic cross-sectional view of a reference example 1 of the solar cell module.

A solar cell module of a configuration shown in FIG. 5 was prepared by superposing, on the light entrance side of a photovoltaic element 1005 prepared as explained before, an EVA sheet (thickness 460 μm; manufactured by Mobay) as the filler 1006 and an ETFE film (thickness 38 μm; Tefzel manufactured by duPont) as the outermost surface 1007, and also superposing a nylon film (thickness 70 μm; Dartec manufactured by duPont) as the rear insulator 1003; an EVA sheet (thickness 460 μm; manufactured by Mobay) as the rear filler 1002; and a galvanized steel plate 1001 (thickness 0.3 μmm), and effecting lamination in the same manner as in the Example 1.

Reference Example 2

Figure 6:
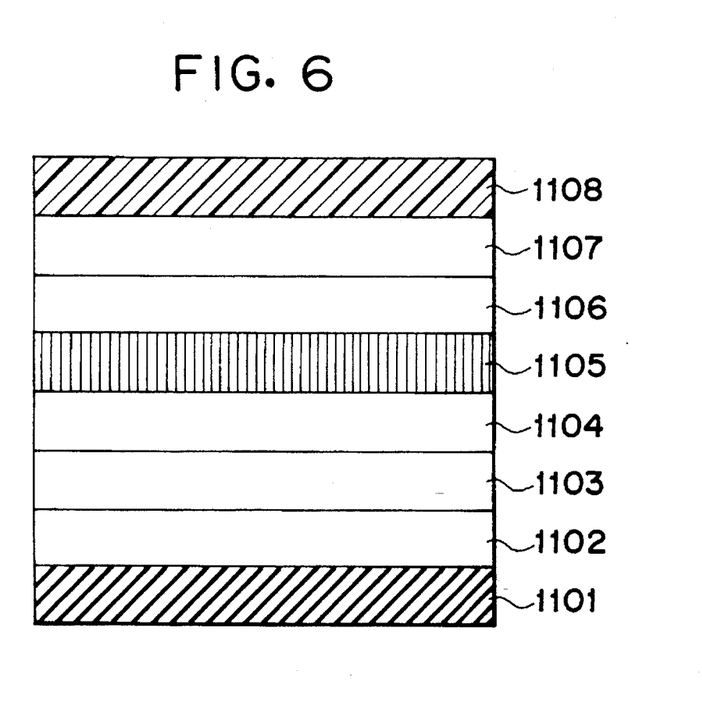
FIG. 6 is a schematic cross-sectional view of another reference example of the solar cell module.

A solar cell module of the configuration shown in FIG. 6 was prepared in the same manner as in the Reference Example 1, except that the EVA filler at the light entrance side was composed of two EVA sheets 1107, 1106 (thickness 460 μm; manufactured by Mobay).

Reference Example 3

Figure 8:
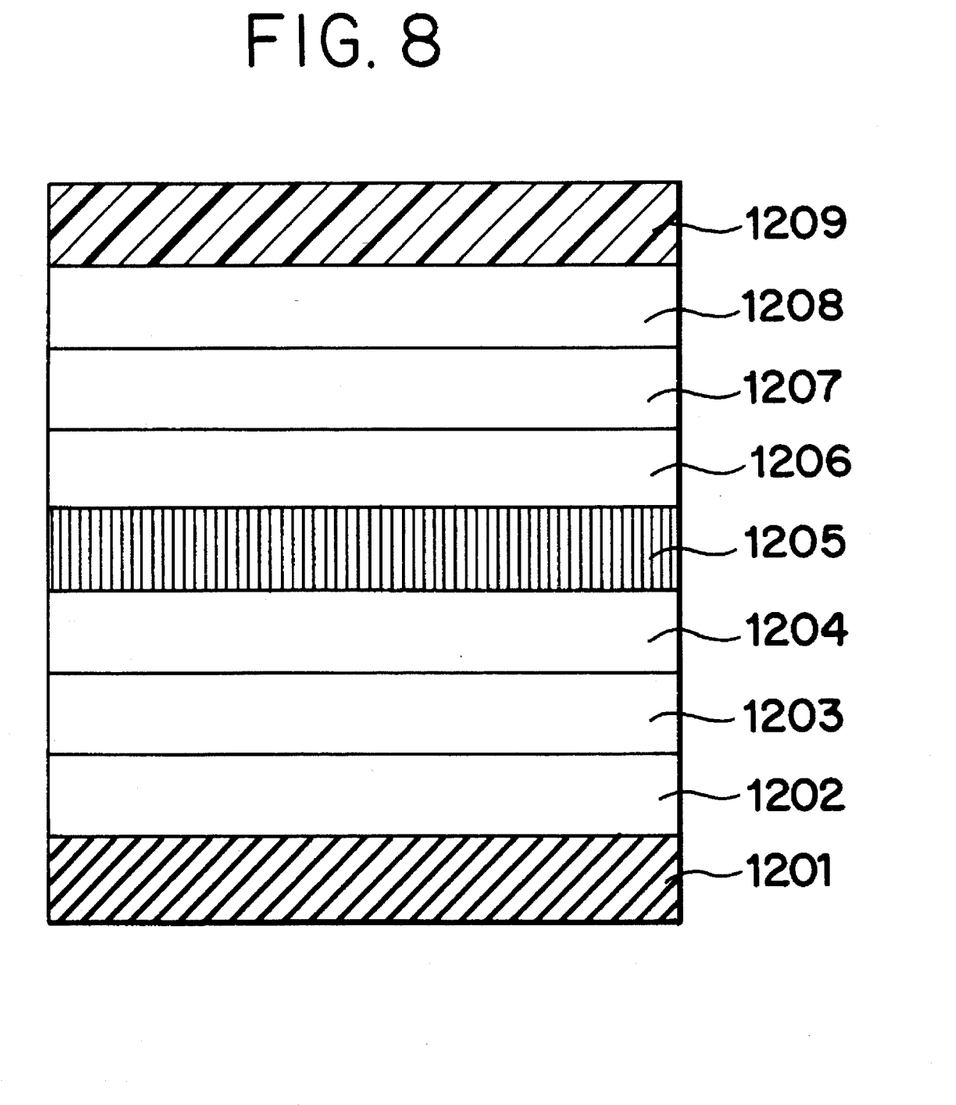
FIG. 8 is a schematic cross-sectional view of another reference example of the solar cell module.

A solar cell module of the configuration shown in FIG. 8 had lamination of layers 1201-1205 conducted in the same manner as layer 1101-1105 in the Example 1, employing, at the light entrance side of a photovoltaic element 1205 prepared as explained above, an EVA sheet 1206 (thickness 460 μm; manufactured by Mobay) as the filler (corresponding to 1106); a glass (Crane glass 230 manufactured by Crane Glass Co.) as a reinforcing layer 1207; an EVA sheet (thickness 460 μm; manufactured by Mobay) as the filler 1208; and an ETFE film (thickness 38 μm; Tefzel manufactured by duPont) as the outermost surface 1209.

The results of evaluations of the solar cell modules of the foregoing examples and reference examples are summarized in Table 1.

be prevented by the addition of an inorganic ultraviolet absorber in said trifluorochloroethylene-vinyl copolymer. Moreover, the weather resistance can be improved by the use of a filler consisting of fluorinated resin. Furthermore, scratch resistance and safety can be improved by the use of a hard film. A pencil surface hardness of 2H to 4H in the trifluorochloroethylene-vinyl copolymer can improve the scratch resistance, thereby protecting the module form scars and damage.

What is claimed is:

1. A solar cell module provided with a photovoltaic element having at least a photoactive semiconductor layer as the photoelectric converting member, comprising a layer of trifluorochloroethylene-vinyl copolymer at least at the outermost surface of the surface covering material at the light entrance side.

2. A solar cell module according to claim 1, wherein said photoactive semiconductor layer is composed of a non-monocrystalline semiconductor film.

3. A solar cell module according to claim 2, wherein said non-monocrystalline semiconductor film is composed of amorphous silicon.

4. A solar cell module according to claim 1, wherein said surface covering material is composed of trifluorochloroethylene-vinyl copolymer laminated on a hard film and adhered to the photoelectric converting member with a filler.

5. A solar cell module according to claim 4, wherein said hard film is composed of a resinous material with a thermal deformation temperature of 70° C. or higher.

6. A solar cell module according to claim 4, wherein said hard film is composed of acrylic resin, polycarbonate resin, or polyester resin.

7. A solar cell module according to claim 4, wherein said filler is composed of fluorinated resin.

8. A solar cell module according to claim 1, wherein said trifluorochloroethylene-vinyl copolymer has a pencil surface hardness within a range of 2H to 4H.

9. A solar cell module according to claim 1, wherein said trifluorochloroethylene-vinyl copolymer contains an ultraviolet absorber consisting of an inorganic compound.

10. A solar cell module according to claim 9, wherein said ultraviolet absorber is composed of titanium oxide, yttrium oxide, or cecium oxide.

11. A solar cell module according to claim 1 wherein said triluorochloroethylene-vinyl copolymer contains an isocyanate.

TABLE 1

|  | Initial conv. efficiency | Weather resistance | Tem/humidity cycle test | Scratch resistance | Flame retarding property |
| --- | --- | --- | --- | --- | --- |
| Example 1 | 8.0 | + | + | + | + |
| Example 2 | 8.0 | ± | + | + | + |
| Example 3 | 8.0 | ± | + | + | + |
| Example 4 | 8.0 | ± | ± | + | + |
| Example5 | 8.0 | ± | + | + | + |
| Example 6 | 8.0 | ± | ± | + | + |
| Reference Example 1 | 8.0 | − | ± | − | − |
| Reference Example 2 | 8.0 | − | ± | +/− | − |
| Reference Example 3 | 8.0 | − | ± | + | − |

According to the present invention, the weather resistance can be improved by covering the surface of the solar cell module at the light entrance side with trifluorochloroethylene-vinyl copolymer. Also, deterioration of the covering material of the photovoltaic element by ultraviolet light can 12. A solar cell module according to claim 11, wherein said trifluorochloroethylene-vinyl copolymer contains an isocyanate blocking agent.

* * * * *

UNITED STATES PATENT AND TRADEMARK OFFICE
CERTIFICATE OF CORRECTION

PATENT NO. : 5,482,571

DATED : January 9, 1996

INVENTOR(S): SATORU YAMADA ET AL.

It is certified that error appears in the above-identified patent and that said Letters Patent is hereby corrected as shown below:

COLUMN 1

Line 33, "form" should read --from--.
    Line 53, "Col," should read --Co.,--.

COLUMN 2

Line 5, "extend" should read --extended--.

COLUMN 3

Line 18, "thee" should read --there--.

COLUMN 4

Line 40, "form" should read --from--.

COLUMN 5

Line 2, "eh" should read --the--.
    Line 10, "an" should read --and--.

UNITED STATES PATENT AND TRADEMARK OFFICE
CERTIFICATE OF CORRECTION

PATENT NO. : 5,482,571

DATED : January 9, 1996

INVENTOR(S): SATORU YAMADA ET AL.

It is certified that error appears in the above-identified patent and that said Letters Patent is hereby corrected as shown below:

COLUMN 6

Line 15, "preferably" should read --preferable--.
    Line 41, "leasing" should read --leading--.
    Line 54, "educing" should read --reducing--.

COLUMN 7

Line 33, "diisocyante," should read --diisocyanate,--.
    Line 34, "bis(phenylisocyanate)" should read --bis(phenylisocyanate),--.
    Line 38, "fin" should read --in--.
    Line 39, "polyhudric" should read --polyhydric--.

COLUMN 8

Line 18, "feature" should read --featured--.
    Line 51, "element" should read --elements--.

COLUMN 10

Line 8, "shown and" should read --show any--.
    Line 55, "acylic" should read --acrylic--.
    Line 61, "papered" should read --prepared--.

UNITED STATES PATENT AND TRADEMARK OFFICE
CERTIFICATE OF CORRECTION

PATENT NO. : 5,482,571

DATED : January 9, 1996

INVENTOR(S): SATORU YAMADA ET AL.

It is certified that error appears in the above-identified patent and that said Letters Patent is hereby corrected as shown below:

COLUMN 11

Line 2, "sowed" should read --showed--.
Line 17, "0.3 μmm)," should read --0.3 mm),--.

COLUMN 12

Line 7, "form" should read --from--.
Line 41, "claim 1" should read --claim 1,--.
Line 42, "triluorochloroethylene-vinyl" should read ---trifluorochloethylene-vinyl--.

Signed and Sealed this

Second Day of July, 1996

BRUCE LEHMAN

Attest:

Attesting Officer

Commissioner of Patents and Trademarks